United States Patent
Foroozesh et al.

(10) Patent No.: US 10,680,305 B2
(45) Date of Patent: Jun. 9, 2020

(54) SIGNAL HANDLING DEVICE INCLUDING A SURFACE INTEGRATED WAVEGUIDE AND A RESONATING CAVITY FORMED IN MULTIPLE SUBSTRATE LAYERS

(71) Applicant: Aptiv Technologies Limited, St. Michael OT (BB)

(72) Inventors: Alireza Foroozesh, Westlake Village, CA (US); George J. Purden, Westlake Village, CA (US); Shawn Shi, Thousand Oaks, CA (US)

(73) Assignee: Aptiv Technologies Limited (BB)

( * ) Notice: Subject to any disclaimer, the term of this patent is extended or adjusted under 35 U.S.C. 154(b) by 0 days.

(21) Appl. No.: 15/934,126

(22) Filed: Mar. 23, 2018

(65) Prior Publication Data

US 2019/0245257 A1    Aug. 8, 2019

Related U.S. Application Data

(60) Provisional application No. 62/628,038, filed on Feb. 8, 2018.

(51) Int. Cl.
| | | |
|---|---|---|
| H01P 3/12 | (2006.01) | |
| H05K 1/02 | (2006.01) | |
| H05K 1/11 | (2006.01) | |
| H01P 5/02 | (2006.01) | |

(52) U.S. Cl.
CPC .............. *H01P 3/121* (2013.01); *H01P 5/024* (2013.01); *H05K 1/0242* (2013.01); *H05K 1/0251* (2013.01); *H05K 1/115* (2013.01)

(58) Field of Classification Search
CPC .......... H01P 5/087; H01P 5/103; H01P 5/107; H01P 3/121

USPC .................................................. 333/21 R, 26
See application file for complete search history.

(56) References Cited

U.S. PATENT DOCUMENTS

| | | | |
|---|---|---|---|
| 2008/0309427 A1 | 12/2008 | Kim et al. | |
| 2010/0245155 A1* | 9/2010 | Miyazato et al. | G01S 7/032 342/104 |
| 2011/0057743 A1* | 3/2011 | Shimura et al. | H01P 5/024 333/26 |
| 2012/0319796 A1 | 12/2012 | Miyata | |
| 2014/0168024 A1* | 6/2014 | Lee et al. | H01Q 13/06 343/767 |
| 2018/0226709 A1* | 8/2018 | Mangaiahgari | H01P 3/121 |

FOREIGN PATENT DOCUMENTS

| | | |
|---|---|---|
| EP | 1 195 839 A1 | 4/2002 |
| EP | 2 426 782 A1 | 3/2012 |
| JP | 2004 135095 A | 4/2004 |

OTHER PUBLICATIONS

European Search Report for Application No. 19153509.5, European Patent Office, dated Jun. 13, 2019, two pages.

* cited by examiner

Primary Examiner — Benny T Lee
(74) Attorney, Agent, or Firm — Joseph V. Bonadies

(57) ABSTRACT

A signal handling device includes a first substrate. A plurality of first conductors in the first substrate are arranged to form a substrate integrated waveguide. A second substrate includes a plurality of second conductors arranged to form a resonating cavity near one end of the substrate integrated waveguide. A signal carrier is aligned with the one end of the substrate integrated waveguide.

15 Claims, 5 Drawing Sheets

SIGNAL HANDLING DEVICE INCLUDING A SURFACE INTEGRATED WAVEGUIDE AND A RESONATING CAVITY FORMED IN MULTIPLE SUBSTRATE LAYERS

BACKGROUND

A variety of scenarios require signal handling. For example, radar systems and wireless communication systems include over-the-air signaling. One challenge associated with such systems is providing adequate bandwidth in devices that handle such signals.

Sufficient bandwidth is needed in radar systems to provide adequate range resolution. Higher bandwidth typically allows for higher range resolution, which enhances imaging and facilitates accurate target detection. In wireless communications, higher bandwidth corresponds to higher data rates allowing for enhanced services, such as video streaming and other data transfer.

Some existing signal handling devices include a transition from a substrate integrated waveguide to an orthogonally oriented, air-filled waveguide. The bandwidth of such devices is typically very narrow resulting in poor manufacturability. One attempt at increasing the bandwidth for such devices has been to include metal plates to establish a resonating cavity. Such plates have to be particularly designed for particular applications, which introduces manufacturing inefficiencies. Additionally, such plates increase the cost of the device.

SUMMARY OF THE INVENTION

A signal handling device includes a first substrate. A plurality of first conductors in the first substrate are arranged to form a substrate integrated waveguide. A second substrate includes a plurality of second conductors arranged to form a resonating cavity near one end of the substrate integrated waveguide. A signal carrier is aligned with the one end of the substrate integrated waveguide and the resonating cavity.

In an example embodiment having one or more features of the signal handling device of the previous paragraph, the first substrate comprises a dielectric material, the first conductors comprise vias, the second substrate comprises a dielectric material, the second conductors comprise vias, and the signal carrier comprises a waveguide.

In an example embodiment having one or more features of the signal handling device of any of the previous paragraphs, the waveguide comprises an air-filled waveguide.

In an example embodiment having one or more features of the signal handling device of any of the previous paragraphs, the first substrate is planar, the second substrate is planar and parallel with the first substrate, the signal carrier is at least partially transverse to the first substrate.

In an example embodiment having one or more features of the signal handling device of any of the previous paragraphs, the signal carrier is at least partially perpendicular to the first substrate.

An example embodiment having one or more features of the signal handling device of any of the previous paragraphs includes a pressure sensitive adhesive aligned with one side of the first substrate and wherein at least a portion of one end of the signal carrier is secured to the pressure sensitive adhesive.

An example embodiment having one or more features of the signal handling device of any of the previous paragraphs includes a first conductive layer on one side of the first substrate, the first conductive layer being in conductive contact with the first conductors, the first conductive layer including a first opening aligned with the one end of the substrate integrated waveguide; a second conductive layer on an oppositely facing side of the first substrate, the second conductive layer being in conductive contact with the first conductors, the second conductive layer including a second opening aligned with the first opening; an adhesive in contact with the second conductive layer, the adhesive securing the second substrate and the second conductive layer together; and a third conductive layer on a side of the second substrate that faces away from the first substrate, the third conductive layer being in conductive contact with the second conductors.

An example embodiment having one or more features of the signal handling device of any of the previous paragraphs includes a conductive ribbon layer in contact with the adhesive layer and the second substrate, the conductive ribbon layer being aligned with and in conductive contact with the second conductors.

In an example embodiment having one or more features of the signal handling device of any of the previous paragraphs, the conductive ribbon establishes a barrier to prevent signal leakage from the second conductors through the adhesive layer.

In an example embodiment having one or more features of the signal handling device of any of the previous paragraphs, the conductive ribbon establishes a frame corresponding to a perimeter of the resonating cavity formed by the second conductors and the conductive ribbon has an opening aligned with the first and second openings.

In an example embodiment having one or more features of the signal handling device of any of the previous paragraphs, the adhesive in contact with the second conductive layer comprises a fibrous material impregnated with a resin.

In an example embodiment having one or more features of the signal handling device of any of the previous paragraphs, each of the conductive layers comprises metal.

In an example embodiment having one or more features of the signal handling device of any of the previous paragraphs, the first opening is generally rectangular, the first opening has four sides, three sides of the first opening are bordered by at least some of the first conductors, the second opening is generally rectangular, and the second opening is surrounded by at least some of the second conductors.

In an example embodiment having one or more features of the signal handling device of any of the previous paragraphs, the at least some of the first conductors that border the three sides of the first opening are coaxial with respective ones of the at least some of the second conductors.

In an example embodiment having one or more features of the signal handling device of any of the previous paragraphs, others of the first conductors are arranged in two parallel lines and the others of the first conductors establish a fence of the substrate integrated waveguide.

Various features and advantages of at least one disclosed example embodiment will become apparent to those skilled in the art from the following detailed description. The drawings that accompany the detailed description can be briefly described as follows.

DETAILED DESCRIPTION OF THE INVENTION

A signal handling device designed according to an embodiment of this invention includes a resonating cavity formed by conductors in a dielectric substrate that facilitates propagating an electromagnetic wave from a substrate integrated waveguide to a transversely oriented waveguide. Embodiments of this invention increase bandwidth compared to previous devices that include a transition from a substrate integrated waveguide to an air-filled waveguide. For example, some embodiments provide up to four times the bandwidth available with previous signal handling devices.

Figure 1:
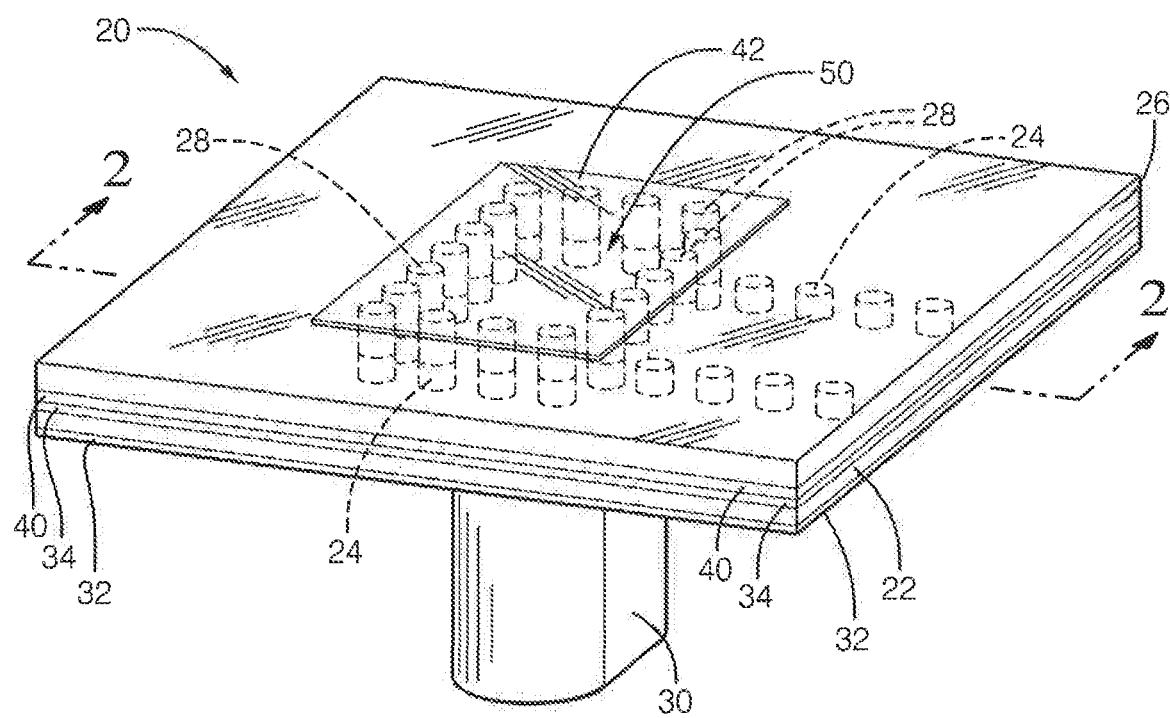
FIG. 1 diagrammatically illustrates a signal handling device designed according to an embodiment of this invention.
Figure 2:
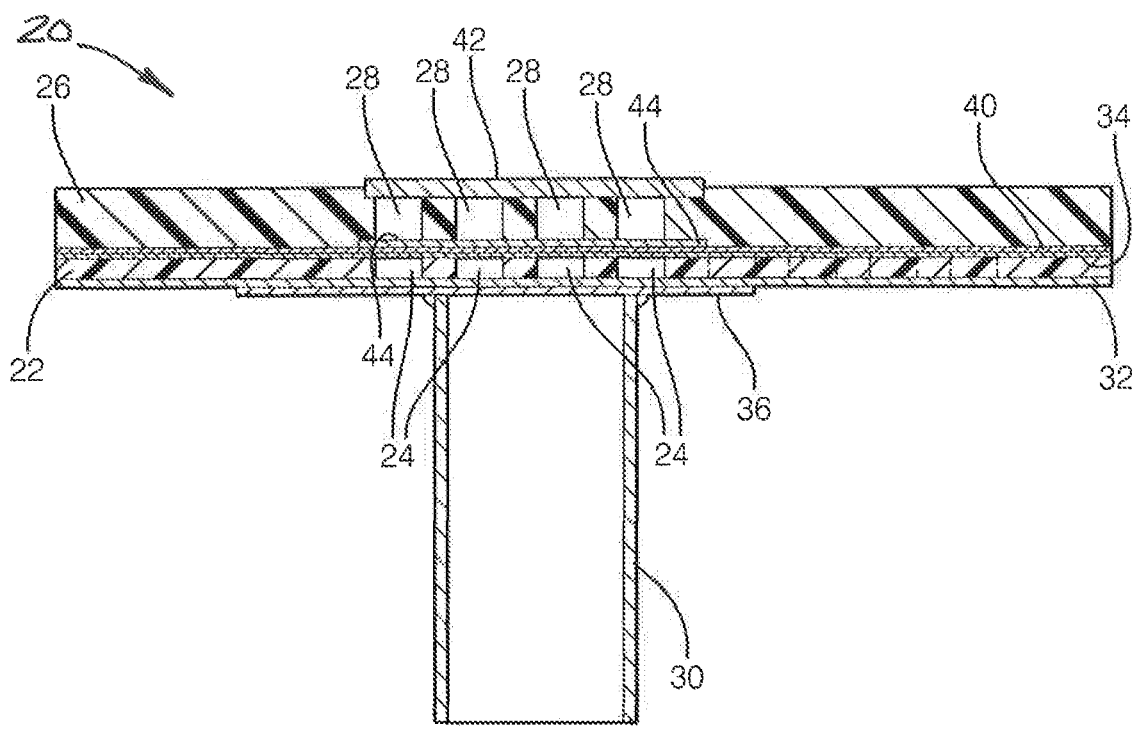
FIG. 2 is a cross-sectional illustration taken along the lines 2-2 in FIG. 1.

FIGS. 1 and 2 diagrammatically illustrate a signal handling device 20 that may be used for a variety of purposes. One example use includes signal handling for devices mounted on an automotive vehicle. Some implementations are useful for automated vehicles that have autonomous or semi-autonomous vehicle control features. Another useful implementation of an embodiment of this invention is for wireless communications.

The example signal handling device 20 includes a first substrate 22 that comprises a dielectric material that is not conductive. As can be appreciated from FIGS. 1 and 2, the first substrate 22 includes a plurality of first conductors 24 that are arranged to form a substrate integrated waveguide. A second substrate 26 comprises a dielectric material that is not conductive. The second substrate 26 includes a plurality of second conductors 28 that are arranged to form a resonating cavity 50 (FIG. 1) or backshort near one end of the substrate integrated waveguide.

An air-filled waveguide 30 is oriented at least partially transverse to the first substrate 22. In this example, the air-filled waveguide 30 is oriented perpendicular to the first substrate 22. As shown in FIG. 2, a pressure sensitive adhesive layer 36, which is not conductive, facilitates securing the waveguide 30 to the first substrate 22. The device 20 includes features that facilitate handling signals, such as electromagnetic waves, that propagate in the substrate integrated waveguide formed by the first conductors 24 and are converted to electromagnetic waves that propagate in the air-filled waveguide 30.

The first substrate 22 includes a conductive layer 32 on one side of the first substrate 22. Another conductive layer 34 is situated on an opposite side of the first substrate 22. The conductive layers 32 and 34 in this example comprises a sheet or layer of conductive metal such as copper. The conductive layers 32 and 34 respectively contact the ends of the first conductors 24.

An adhesive layer 40 secures the second substrate 26 to the conductive layer 34 of the first substrate 22. The adhesive layer 40 in the illustrated example embodiment comprises a nonconductive prepreg layer including a fibrous material impregnated with a resin. A conductive layer 42 is situated on one side of the second substrate 26. The conductive layer 42 contacts one end of the second conductors 28 and provides a cap over the resonating cavity 50 established by the second conductors 28.

Another conductive layer 44 (FIG. 2) is situated along a portion of an opposite side of the conductors 28 facing the first substrate 22. The conductive layer 44 in this example comprises a ribbon of conductive metal, such as copper, that prevents electromagnetic leakage from the second conductors 28 into and through the adhesive layer 40.

The illustrated arrangement utilizes a substrate integrated waveguide formed by the first conductors 24 in the first substrate 22 and a backshort or resonating cavity formed by the second conductors 28 in the second substrate 26. The resonating cavity 50 is aligned with the air-filled waveguide 30 of the device 20. That alignment facilitates converting an electromagnetic wave propagating through the substrate integrated waveguide into an electromagnetic wave propagating through the air-filled waveguide 30.

Figure 3:
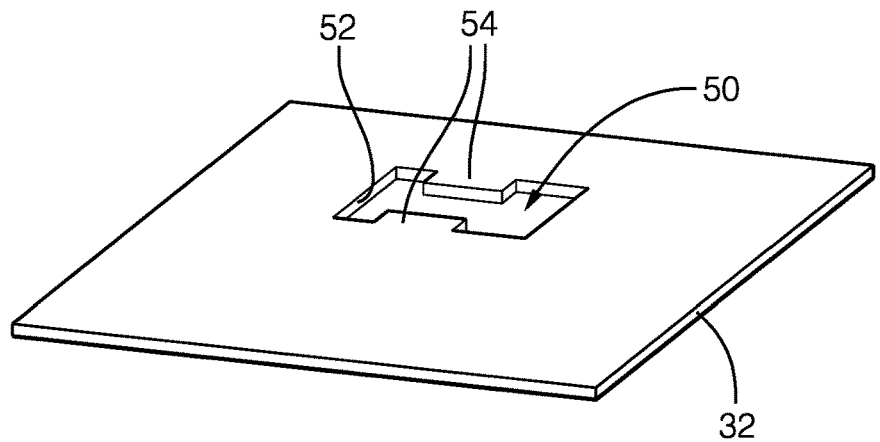
FIG. 3 diagrammatically illustrates a conductive layer useful in an embodiment of this invention.

A further understanding of the structure and arrangement of the example device 20 can be appreciated by considering the different layers of the device and how they are arranged relative to each other. FIGS. 3-10 show the various layers sequentially adjacent each other in a layer-by-layer presentation for discussion purposes, where like features in these figures are denoted by the same reference number. FIG. 3 illustrates an example conductive layer 32, such as a sheet of copper. In this example, the conductive layer 32 includes an opening 52 that is aligned with the waveguide 30 in the fully assembled device 20 (as seen in FIG. 1, for example). The opening 52 may be established, for example, by etching away a corresponding area of the conductive layer 32. The illustrated example opening 52 includes tabs 54 that are dimensioned to provide microwave matching structures. Those skilled in the art who have the benefit of this description will understand how the dimensions of the opening 52 and the tabs 54 may be selected or tuned to control the coupling between the substrate integrated waveguide of the first substrate 22 and the waveguide 30. The dimensions or configuration of the opening 52 may also serve as a secondary adjustment of frequency.

Figure 4:
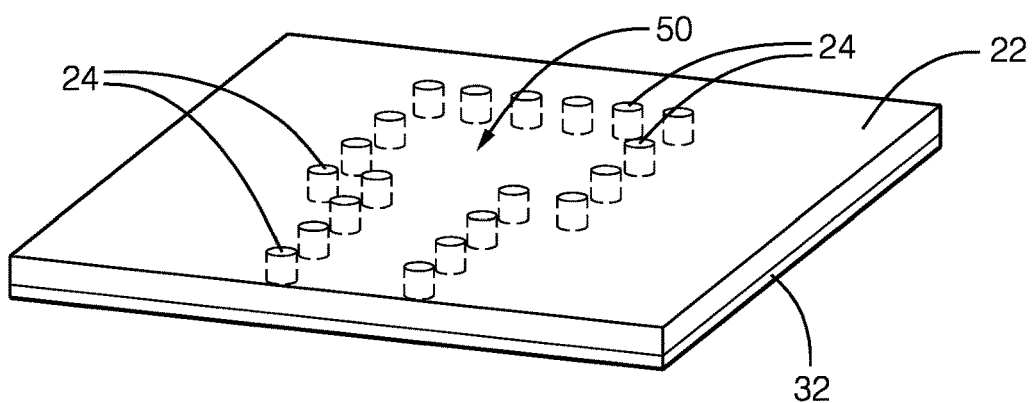
FIG. 4 diagrammatically illustrates the conductive layer of FIG. 3 and a dielectric substrate layer including a substrate integrated waveguide.

FIG. 4 illustrates the first substrate 22 on top of the conductive layer 32. In this example, the first substrate 22 comprises a dielectric layer and the first conductors 24 comprise vias in the first substrate 22. In some example embodiments, the first conductors 24 are open or empty vias while in other embodiments the vias are at least partially filled with a conductive material.

As shown in FIG. 4, one end of the substrate integrated waveguide formed by the first conductors 24 is aligned with the opening 52 (FIG. 3) to facilitate converting an electromagnetic wave propagating in the substrate integrated waveguide to an electromagnetic wave that propagates in the air-filled waveguide 30 (FIGS. 1 and 2). Some of the first conductors 24 border three of the four sides of the opening 52 in this example and surround the eventually established resonating cavity 50. The fourth side of the opening 52 faces toward the port of the substrate integrated waveguide.

Figure 5:
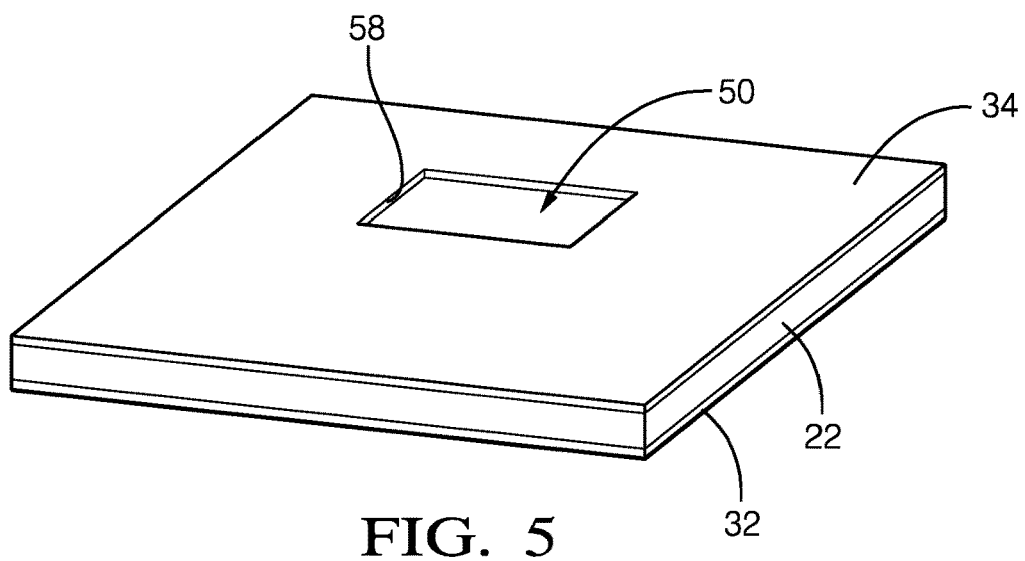
FIG. 5 diagrammatically illustrates a conductive layer on top of the layers shown in FIG. 4.

FIG. 5 shows the conductive layer 34 on an opposite side of the substrate 22 from the conductive layer 32. The conductive layer 34 includes an opening 58 aligned with the opening 52 of the conductive layer 32 and the eventually established resonating cavity 50. In some embodiments, the conductive layer 34 comprises a sheet of metal, such as copper and the opening 58 is established by etching away a corresponding portion of the layer 34.

Figure 6:
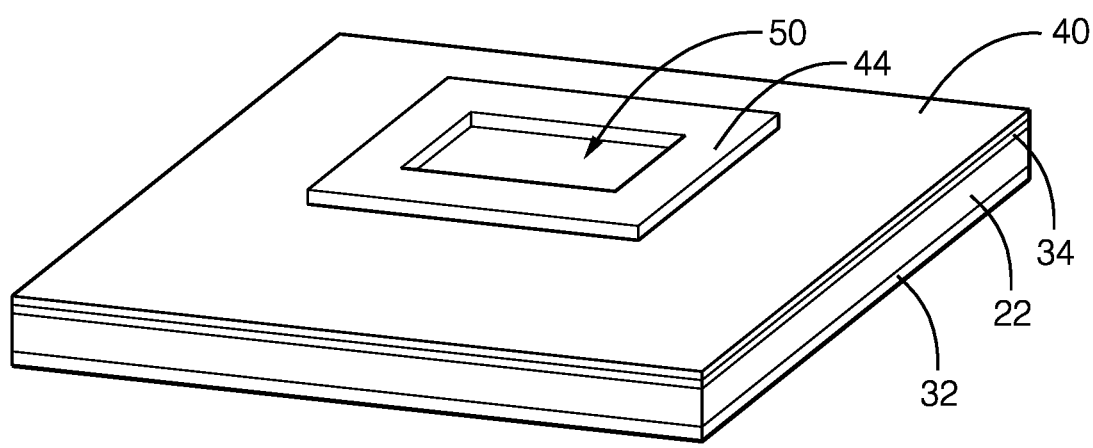
FIG. 6 diagrammatically illustrates an adhesive layer and a conductive ribbon on top of the layers shown in FIG. 5.

FIG. 6 shows the adhesive layer 40 against the conductive layer 34 aligned with the eventually established resonating cavity 50. In FIG. 6, the conductive ribbon 44 is shown in contact with the adhesive layer 40. The conductive ribbon 44 in this example has the configuration of a rectangular frame that surrounds the area of the adhesive layer 40 that is aligned with the openings 52 (FIG. 3) and 58 (FIG. 5). The conductive ribbon 44 in some embodiments comprises a thin layer of copper. The conductive ribbon 44 functions as a cap for one side or end of the second conductors 28 (FIGS. 1 and 2). The dimensions of the conductive ribbon 44 are selected to act as a band-stop filter to minimize or eliminate electromagnetic energy leakage into and through the nonconductive adhesive layer 40. Those skilled in the art who have the benefit of this description will be able to select a ribbon configuration and dimensions to meet their particular needs.

Figure 7:
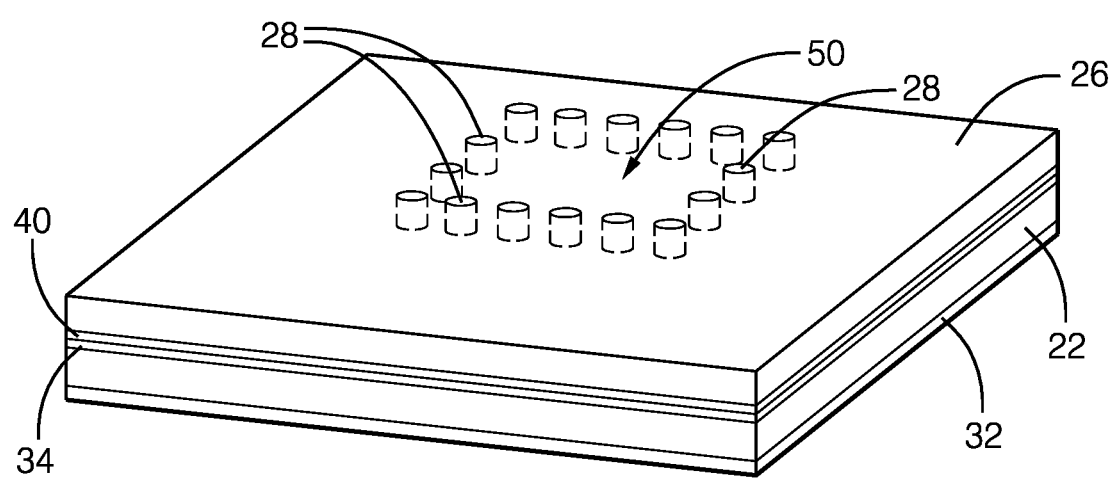
FIG. 7 diagrammatically illustrates a dielectric substrate layer on top of the layers shown in FIG. 6 in which the substrate includes conductors that form a resonating cavity.

FIG. 7 shows the second substrate 26 situated on the adhesive layer 40. The second conductors 28 establish a border around the resonating cavity 50 that facilitates converting an electromagnetic wave propagating through the substrate integrated waveguide of the first substrate 22 into an electromagnetic wave propagating through the air-filled waveguide 30 (FIGS. 1 and 2).

In the illustrated example, the second conductors 28 comprise vias in the second substrate 26. In some embodiments, the vias are empty or hollow while in others they are at least partially filled with a conductive material.

Figure 8:
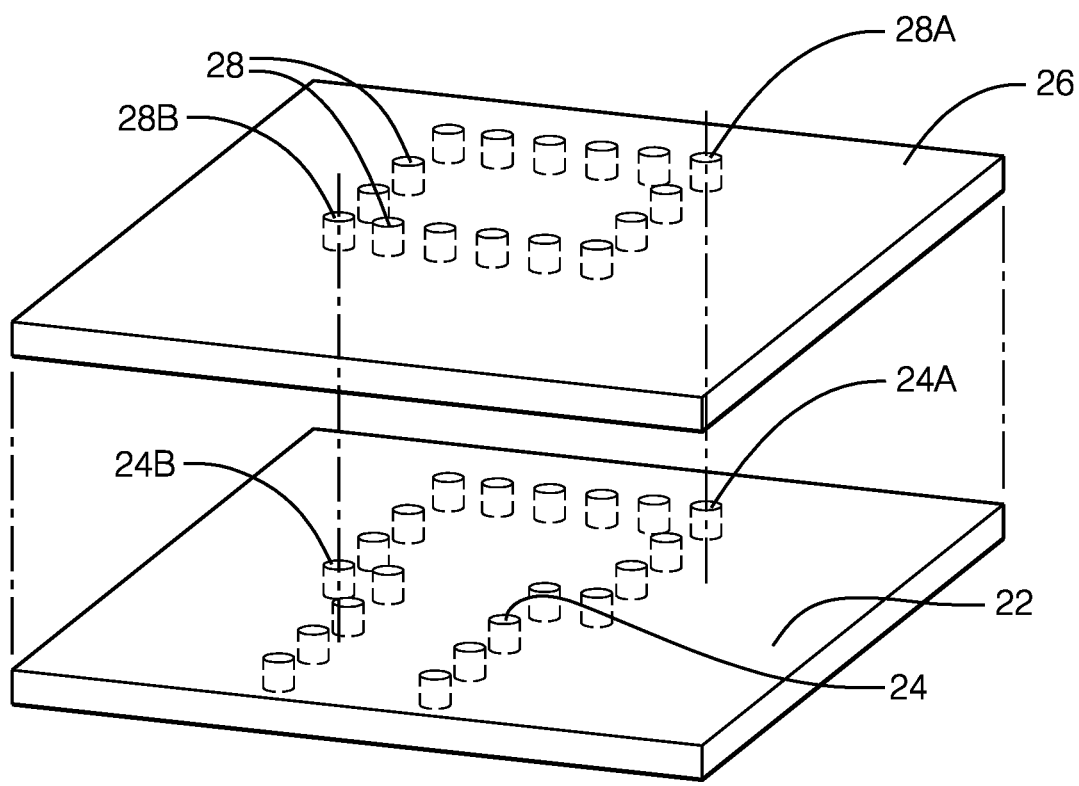
FIG. 8 diagrammatically illustrates positional relationships among the conductors in the substrate layers of the example signal handling device.

FIG. 8 illustrates the positional relationship among the conductors 28 and 24. The second conductors 28 that border the area aligned with the opening 52 (FIG. 3) are aligned with some of the first conductors 24 that border some of the opening 52. Those first conductors 24 are coaxial with corresponding ones of the second conductors 28. For example, the first conductors 24a and 24b are respectively coaxially aligned with the second conductors 28A and 28B. The alignment of conductors can also be appreciated from FIGS. 1 and 2. Others of the first conductors 24 that establish the fence of the substrate integrated waveguide in the substrate 22 are not aligned with second conductors 28 in the second substrate 26.

One feature of the illustrated example is that the conductors 24 and 28 of the respective substrate layers do not have to be directly connected to each other. This provides a more economical manufacturing process and reduces overall cost. Securing the substrates 22 and 26 together using the adhesive 40 (FIGS. 1, 2 and 7, for example) makes the manufacturing process for making the device 20 (FIG. 1, for example) economical. The conductive ribbon 44 (FIG. 6) aligned with the second conductors 28 provides a cap to prevent leakage into or through the adhesive layer 40.

Figure 9:
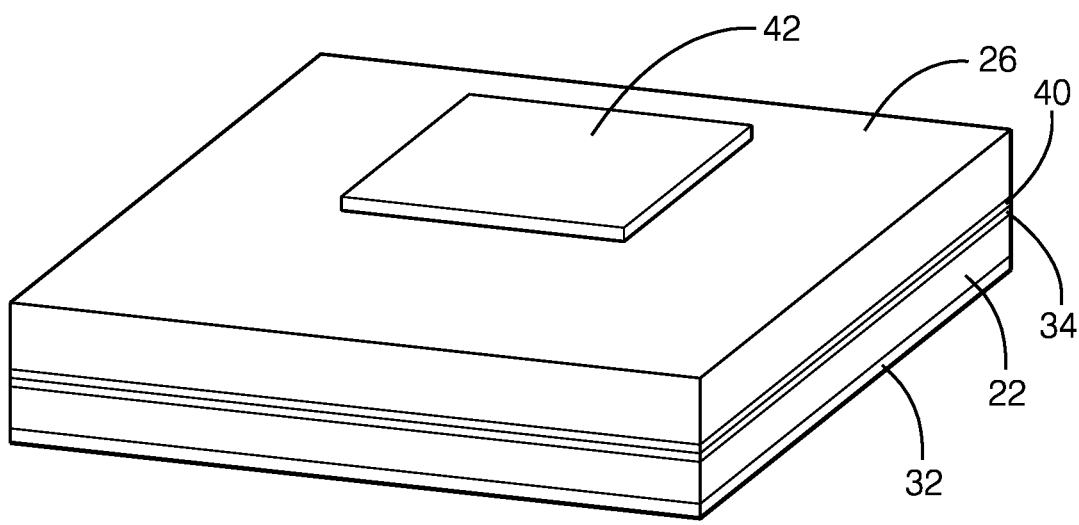
FIG. 9 diagrammatically illustrates a conductive layer on top of the layers shown in FIG. 7.

FIG. 9 shows a conductive layer 42 adjacent the second substrate 26 covering the second conductors 28 on a side of the second substrate 26 that is situated opposite the conductive ribbon 44 (FIG. 6) and facing away from the first substrate 22. The conductive layer 42 in some examples comprises a sheet of copper or another conductive metal. The second conductors 28 and the conductive layer 42 provide the backshort of the resonating cavity 50 (FIGS. 1 and 3-7).

The second substrate layer 26 in some examples includes a thickness that is selected to be approximately one-quarter of the wavelength of a signal frequency of interest in a system into which the signal handling device 20 will be incorporated. Such a substrate thickness is also appropriate for high efficiency antennas such that the device 20 lends itself to highly integrated packaging.

Figure 10:
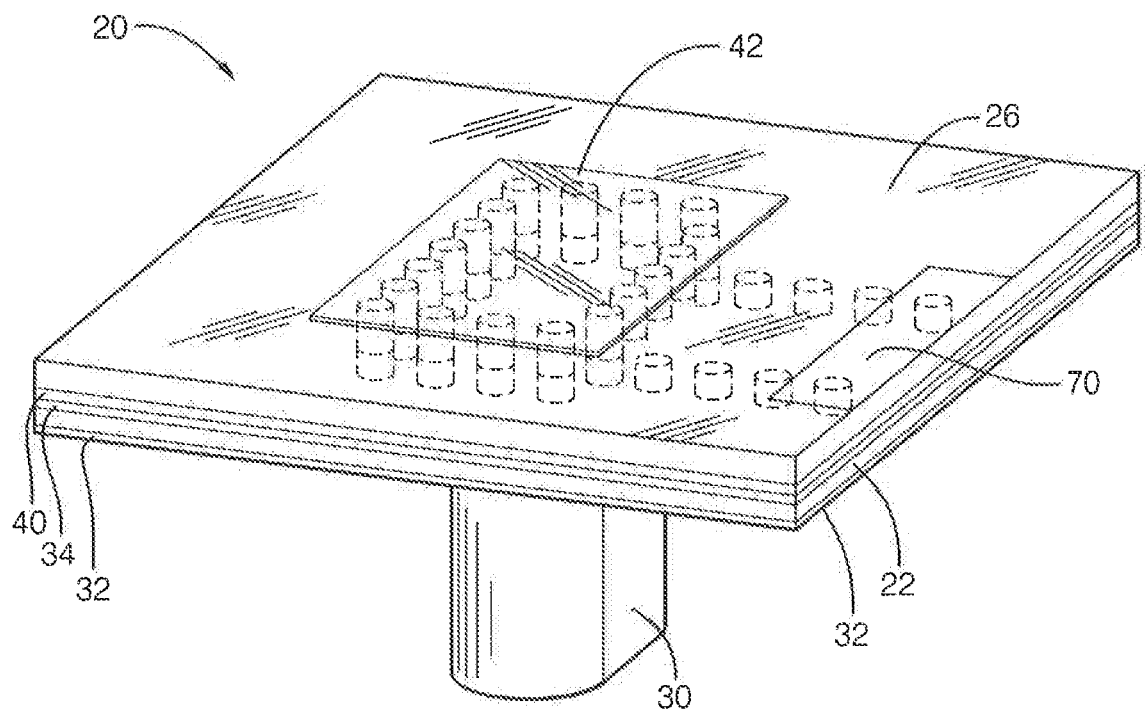
FIG. 10 diagrammatically illustrates another example embodiment of a signal handling device.

FIG. 10 illustrates another example embodiment that includes the additional feature of an antenna layer 70 on the second substrate 26 near the opening or port of the substrate integrated waveguide.

Using the second conductors 28 (FIGS. 1, 2, 7 and 8) and the second substrate 26 to form the resonating cavity or backshort of the device 20 provides a very wideband transition between the substrate integrated waveguide of the first substrate 22 and the air-filled waveguide 30. This is a significant advantage compared to other signal handling devices that have relatively poor bandwidth characteristics. Some embodiments designed consistent with the illustrated example provide a four-fold increase in bandwidth compared to prior devices.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A signal handling device, comprising:
   a first substrate;
   a plurality of first conductors in the first substrate, the plurality of first conductors being arranged to form a substrate integrated waveguide;
   a second substrate;
   a plurality of second conductors in the second substrate, the plurality of second conductors being arranged to form a resonating cavity near one end of the substrate integrated waveguide;
   a signal carrier aligned with the one end of the substrate integrated waveguide; and
   a pressure sensitive adhesive aligned with one side of the first substrate and wherein at least a portion of one end of the signal carrier is secured to the pressure sensitive adhesive.

2. The signal handling device of claim 1, wherein
   the first substrate comprises a dielectric material;
   the plurality of first conductors comprise vias;
   the second substrate comprises a dielectric material;
   the plurality of second conductors comprise vias; and
   the signal carrier comprises a waveguide.

3. The signal handling device of claim 2, wherein the waveguide comprises an air-filled waveguide.

4. The signal handling device of claim 1, wherein
   the first substrate is planar;
   the second substrate is planar and parallel with the first substrate;
   the signal carrier is at least partially transverse to the first substrate.

5. The signal handling device of claim 4, wherein the signal carrier is at least partially perpendicular to the first substrate.

6. A signal handling device, comprising:
   a first substrate;
   a plurality of first conductors in the first substrate, the plurality of first conductors being arranged to form a substrate integrated waveguide;

a second substrate;

a plurality of second conductors in the second substrate, the plurality of second conductors being arranged to form a resonating cavity near one end of the substrate integrated waveguide;

a signal carrier aligned with the one end of the substrate integrated waveguide;

a first conductive layer on one side of the first substrate, the first conductive layer being in conductive contact with the plurality of first conductors, the first conductive layer including a first opening aligned with the one end of the substrate integrated waveguide;

a second conductive layer on an oppositely facing side of the first substrate, the second conductive layer being in conductive contact with the plurality of first conductors, the second conductive layer including a second opening aligned with the first opening;

an adhesive in contact with the second conductive layer, the adhesive securing the second substrate and the second conductive layer together; and a third conductive layer on a side of the second substrate that faces away from the first substrate, the third conductive layer being in conductive contact with the plurality of second conductors.

7. The signal handling device of claim 6, comprising a pressure sensitive adhesive aligned with one side of the first substrate and wherein at least a portion of one end of the signal carrier is secured to the pressure sensitive adhesive.

8. The signal handling device of claim 6, comprising a conductive ribbon layer in contact with the adhesive layer and the second substrate, the conductive ribbon layer being aligned with and in conductive contact with the plurality of second conductors.

9. The signal handling device of claim 8, wherein the conductive ribbon layer establishes a barrier to prevent signal leakage from the plurality of second conductors through the adhesive layer.

10. The signal handling device of claim 8, wherein
the conductive ribbon layer establishes a frame corresponding to a perimeter of the resonating cavity formed by the second conductors; and
the conductive ribbon layer has an opening aligned with the first and second openings.

11. The signal handling device of claim 6, wherein the adhesive in contact with the second conductive layer comprises a fibrous material impregnated with a resin.

12. The signal handling device of claim 6, wherein each of the first, second and third conductive layers comprises metal.

13. The signal handling device of claim 6, wherein
the first opening is generally rectangular;
the first opening has four sides;
three of the four sides of the first opening are bordered by at least some of the plurality of first conductors;
the second opening is generally rectangular; and
the second opening is bordered by at least some of the plurality of second conductors.

14. The signal handling device of claim 13, wherein the at least some of the plurality of first conductors that border the three of the four sides of the first opening are coaxial with respective ones of the at least some of the plurality of second conductors.

15. The signal handling device of claim 13, wherein
others of the plurality of first conductors are arranged in two parallel lines; and
the others of the plurality of first conductors establish a fence of the substrate integrated waveguide.

* * * * *